United States Patent
Shiao et al.

(10) Patent No.: US 9,191,128 B2
(45) Date of Patent: Nov. 17, 2015

(54) SPREAD SPECTRUM CLOCK GENERATOR AND METHOD FOR GENERATING SPREAD SPECTRUM CLOCK SIGNAL

(71) Applicant: National Applied Research Laboratories, Taipei (TW)

(72) Inventors: Yu-Shao Shiao, Hsinchu (TW); Yu-Hsiang Chang, New Taipei (TW); Guo-Wei Huang, Hsinchu (TW)

(73) Assignee: NATIONAL APPLIED RESEARCH LABORATORIES, Taipei (TW)

( * ) Notice: Subject to any disclaimer, the term of this patent is extended or adjusted under 35 U.S.C. 154(b) by 0 days.

(21) Appl. No.: 14/108,769

(22) Filed: Dec. 17, 2013

(65) Prior Publication Data

US 2015/0171918 A1    Jun. 18, 2015

(51) Int. Cl.
  H04B 1/00   (2006.01)
  H04B 15/04  (2006.01)
  H04L 7/033  (2006.01)
  H04L 7/04   (2006.01)

(52) U.S. Cl.
  CPC ............... H04B 15/04 (2013.01); H04L 7/033 (2013.01); H04L 7/043 (2013.01)

(58) Field of Classification Search
  CPC ........ H04B 1/707; H04B 1/69; H04B 1/7075; H04B 15/04; H04B 1/7097; H04J 13/10; H04J 13/00; H03L 7/08989; H03L 7/093; H03L 7/23; H03L 7/1976; H04L 7/033; H04L 7/043

USPC .......... 375/130, 141, 145, 148, 376; 327/147, 327/148, 156, 157, 159
  See application file for complete search history.

(56) References Cited

U.S. PATENT DOCUMENTS

| | | | |
|---|---|---|---|
| 5,631,920 A | 5/1997 | Hardin et al. | |
| 8,416,461 B2 | 4/2013 | Nakazawa et al. | |
| 2004/0198363 A1* | 10/2004 | Zinn | 455/450 |
| 2007/0120585 A1* | 5/2007 | Kishibe | 327/156 |
| 2008/0198959 A1* | 8/2008 | Hasegawa | 375/376 |
| 2009/0140782 A1* | 6/2009 | Huang et al. | 327/156 |
| 2010/0176852 A1 | 7/2010 | Lin et al. | |
| 2011/0019718 A1 | 1/2011 | Chiang et al. | |
| 2011/0133797 A1* | 6/2011 | Sridharan | 327/156 |
| 2012/0327974 A1 | 12/2012 | Kim et al. | |
| 2013/0076450 A1* | 3/2013 | Rao et al. | 331/34 |
| 2013/0285722 A1* | 10/2013 | Chou | 327/157 |

OTHER PUBLICATIONS

Kuo-Hsing Cheng et al., "A 0.77 ps RMS Jitter 6-GHz Spread-Spectrum Clock Generator Using a Compensated Phase-Rotating Technique", IEEE Journal of Solid-State Circuits, Vol. 46, No. 5, May 2011.

(Continued)

Primary Examiner — Syed Haider
(74) Attorney, Agent, or Firm — WPAT, PC; Justin King

(57) ABSTRACT

A spread spectrum clock generator for generating a spread spectrum clock signal is provided. The spread spectrum clock generator includes a phase-locked loop system and a random walk modulator. The random walk modulator generates a modulating signal according to a random walk model. Then, the phase-locked loop system generates a clock signal with spread spectrum in response to the modulating signal. A method for generating the spread spectrum clock signal using the spread spectrum clock generator is also provided.

17 Claims, 8 Drawing Sheets

(56) References Cited

OTHER PUBLICATIONS

Hyung-Rok Lee et al., "A Low-Jitter 5000ppm Spread Spectrum Clock Generator for Multi-channel SATA Transceiver in 0.18μm CMOS", ISSCC 2005 / Session 8 / Circuits for High-Speed Links and Clock-Generators / 8.7.

Sewook Hwang et al., "A 3.5 GHz Spread-Spectrum Clock Generator With a Memoryless Newton-Raphson Modulation Profile", IEEE Journal of Solid-State Circuits, Vol. 47, No. 5, May 2012.

* cited by examiner

SPREAD SPECTRUM CLOCK GENERATOR AND METHOD FOR GENERATING SPREAD SPECTRUM CLOCK SIGNAL

FIELD OF THE INVENTION

The present invention relates to a clock generator and a method for generating clock signals, and particularly to a spread spectrum clock generator and a method for generating spread spectrum clock signals based on phase-locked loop (PLL) systems.

BACKGROUND OF THE INVENTION

Nowadays, a reliable clock generator is essential for every digital circuit to achieve precise timing of events. Such a clock generator is usually implemented by a phase-locked loop (PLL) in highly integrated circuits. For high speed data transmission application, the required clock frequency becomes higher than ever. However, high frequency signal suffers from serious electromagnetic interference (EMI). The electric field strength substantially increases at a center frequency, and this phenomenon may interrupt, obstruct, or degrade the performance of the circuit itself and other circuits. In addition, unpredictable impacts on human health may occur.

Therefore, to solve the aforementioned electromagnetic interference problems, a new clock generator which generates clock signals with reducing electromagnetic interference is needed.

SUMMARY OF THE INVENTION

According to an aspect of the present invention, a spread spectrum clock generator is provided. The spread spectrum clock generator includes a phase-locked loop system and a random walk modulator. The spread spectrum clock generator includes a phase-locked loop system and a random walk modulator. The random walk modulator generates a modulating signal according to a random walk model. Then, the phase-locked loop system generates a clock signal with spread spectrum in response to the modulating signal.

According to another aspect of the present invention, a spread spectrum clock generator is provided. The spread spectrum clock generator includes a phase-frequency detector, a charge pump, a voltage-controlled oscillator, a frequency divider and a random walk modulator. The phase-frequency detector receives and compares a reference clock and a feedback signal, and generates a control signal according to a phase difference between the reference clock and the feedback signal. Then, the charge pump generates a control voltage in response to the control signal from the phase-frequency detector. At last, the voltage-controlled oscillator generates a clock signal according to the control voltage from the charge pump. The clock signal is fed back to the phase-frequency detector for comparison after a down-conversion with a frequency divisor. The random walk modulator generates a modulating signal according to a random walk model to adjust the frequency divisor.

According to a further aspect of the present invention, a method for generating a spread spectrum clock signal by a clock generator is provided. At first, a modulating signal is generated according to a random walk model. Then, the modulating signal is sent to a phase-locked loop system of the clock generator. The phase-locked loop system generates a clock signal with spread spectrum in response to the modulating signal.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for the purpose of illustration and description only. It is not intended to be exhaustive or to be limited to the precise form disclosed.

The electromagnetic interference phenomenon occurs when the electric filed strength concentrates at a specific center frequency or a small frequency range. Therefore, to reduce the electromagnetic interference effect, spread spectrum techniques are utilized in the present application to modulate the clock signals, thereby changing the frequency spectrum of the clock signals such as decreasing the spectral peak or broadening and flattening the shape of the frequency spectrum. It is to be noted that the clock signals should not be spread too much to go beyond the acceptable tolerance.

Figure 1:
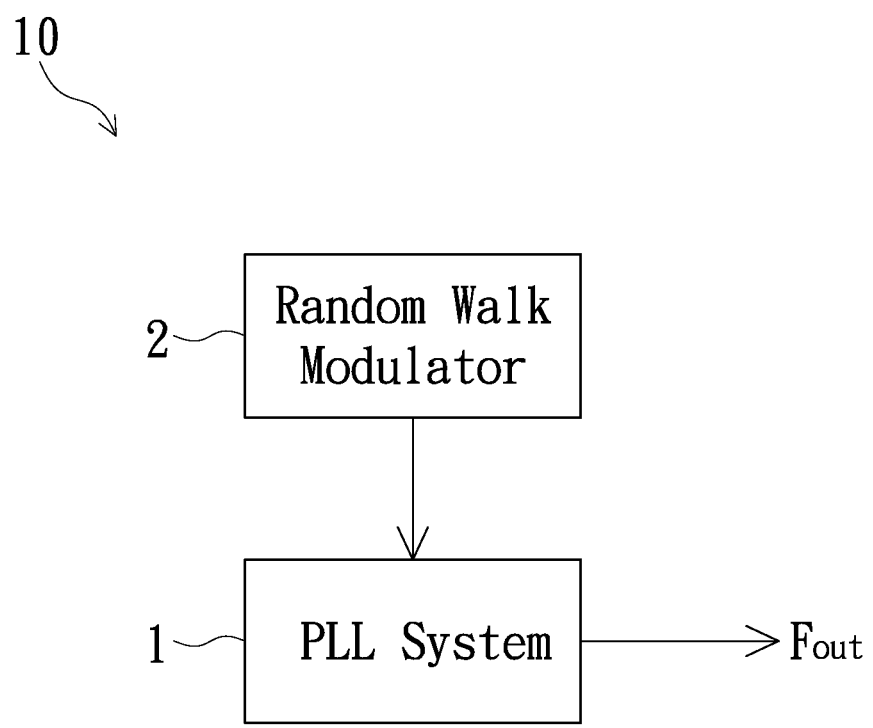
FIG. 1 is a simplified schematic diagram illustrating a spread spectrum clock generator based on a phase-locked loop system according to an embodiment of the present invention.

In FIG. 1, a simplified schematic diagram illustrates a spread spectrum clock generator based on a phase-locked loop system according to an embodiment of the present invention. In the embodiment, the spread spectrum clock generator 10 includes, but not limited to, a phase-locked loop system 1 and a random walk modulator 2. The random walk modulator 2 generates a modulating signal according to a random walk model to modulate at least one signal in the phase-locked loop system 1, so that a clock signal $F_{out}$ generated by the phase-locked loop system 1 is adjusted to have spread spectrum feature.

Figure 2:
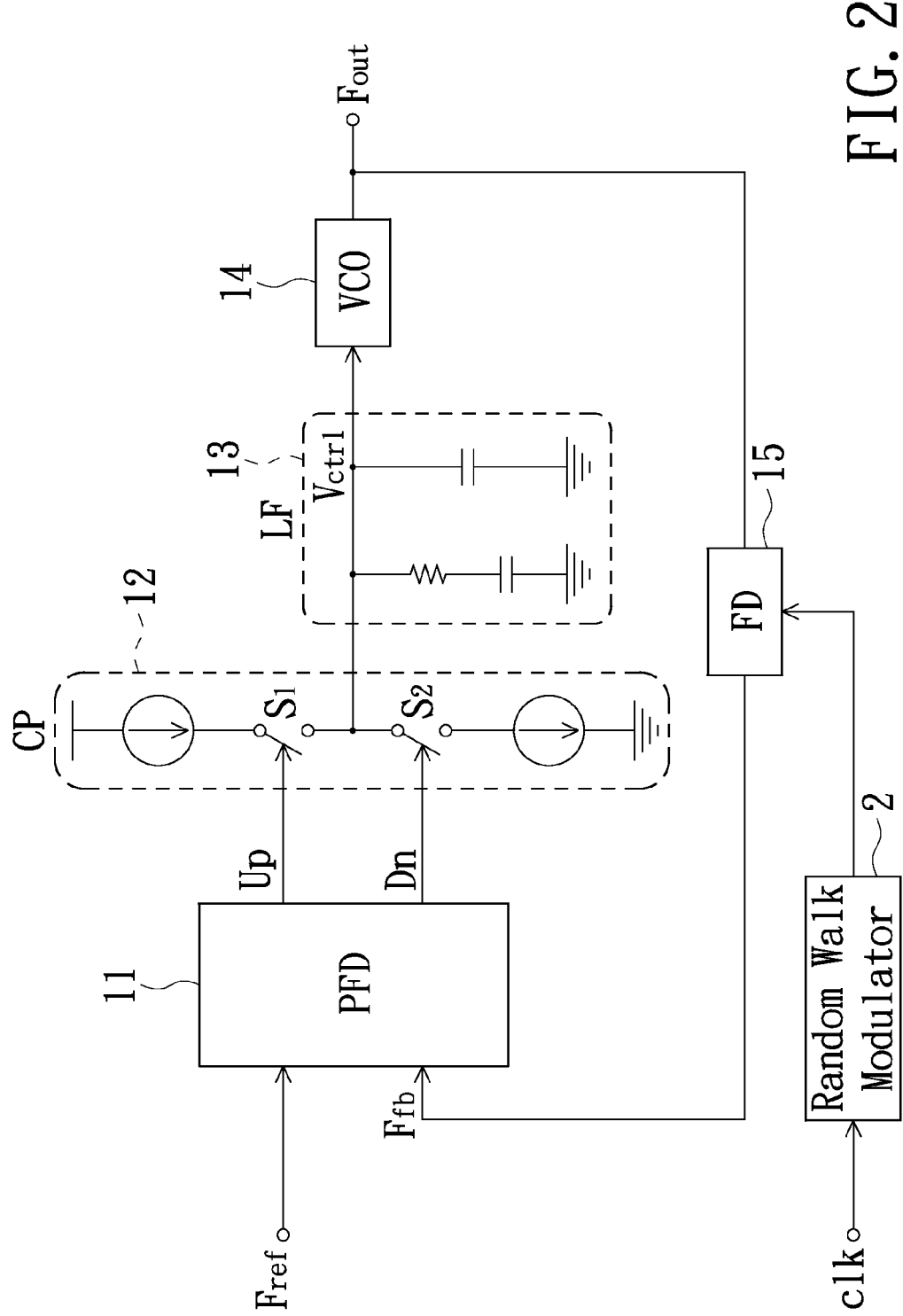
FIG. 2 is a circuit diagram illustrating the spread spectrum clock generator in FIG. 1.

FIG. 2 is a circuit diagram exemplifying a spread spectrum clock generator of FIG. 1. The phase-locked loop system 1 includes a phase-frequency detector (PFD) 11, a charge pump (CP) 12, a loop filter (LF) 13, a voltage-controlled oscillator (VCO) 14 and a frequency divider (FD) 15. The phase-frequency detector 11, the charge pump 12, the loop filter 13 and the voltage-controlled oscillator 14 are connected in series. The connection between any two elements is not limited to electrical connection, and two elements may be in communication through any type of direct or indirect signal transmission. The frequency divider 15 is located at a feedback path from the voltage-controlled oscillator 14 to the phase-frequency detector 11. The spread spectrum clock generator 10 further includes a random walk modulator 2.

The phase-frequency detector 11 may be implemented by a digital circuit. The phase-frequency detector 11 receives and compares two input signals, i.e. a reference clock $F_{ref}$ and a feedback signal $F_{fb}$ from the frequency divider 15, and generates a control signal Up or Dn according to their phase difference and frequency difference. For example, if the reference clock $F_{ref}$ leads the feedback signal $F_{fb}$, the control signal Up is issued. On the contrary, the control signal Dn is issued when the feedback signal $F_{fb}$ leads. The control signals Up and Dn control switches $S_1$ and $S_2$ to steer current into or out of a capacitor of the loop filter 13 to create either a higher or lower control voltage $V_{ctrl}$, i.e. charging or discharging. In each cycle, the time during which the switch $S_1$ or $S_2$ is turned on is proportional to the phase difference and determined by the corresponding control signal Up or Dn. Therefore, charge delivered is dependent on the phase difference/frequency difference between the reference clock $F_{ref}$ and the feedback signal $F_{fb}$. In the following step, the loop filter 13, usually a low pass filter, filters out the high-frequency portion of the control voltage $V_{ctrl}$ to reduce jitter and provide stable control voltage $V_{ctrl}$. Although a second order non-active loop filter is shown in the drawing, it is not intended to limit the order and the type of the loop filter 13 in the present invention. At last, the stabilized control voltage $V_{ctrl}$ drives the voltage-controlled oscillator 14 to generate a clock signal $F_{out}$ at a specific frequency. In another embodiment, the loop filter 13 may be integrated into the charge pump and is not a separate element from the charge pump 12. Furthermore, for some applications, the charge pump 12 is integrated into the phase-frequency detector 11.

The clock signal $F_{out}$ should be down-converted by the frequency divider 15 to provide the feedback signal $F_{fb}$ before being compared with the reference clock $F_{ref}$. If the clock signal $F_{out}$ has phase drifts, the phase-frequency detector 11 timely responds to allow the clock generator 10 to provide stable clock signal $F_{out}$. The frequency divider 15 may be an integer divider. After the down-conversion, the frequency of the feedback signal $F_{fb}$ is 1/N of the frequency of the clock signal $F_{out}$.

Figure 3:
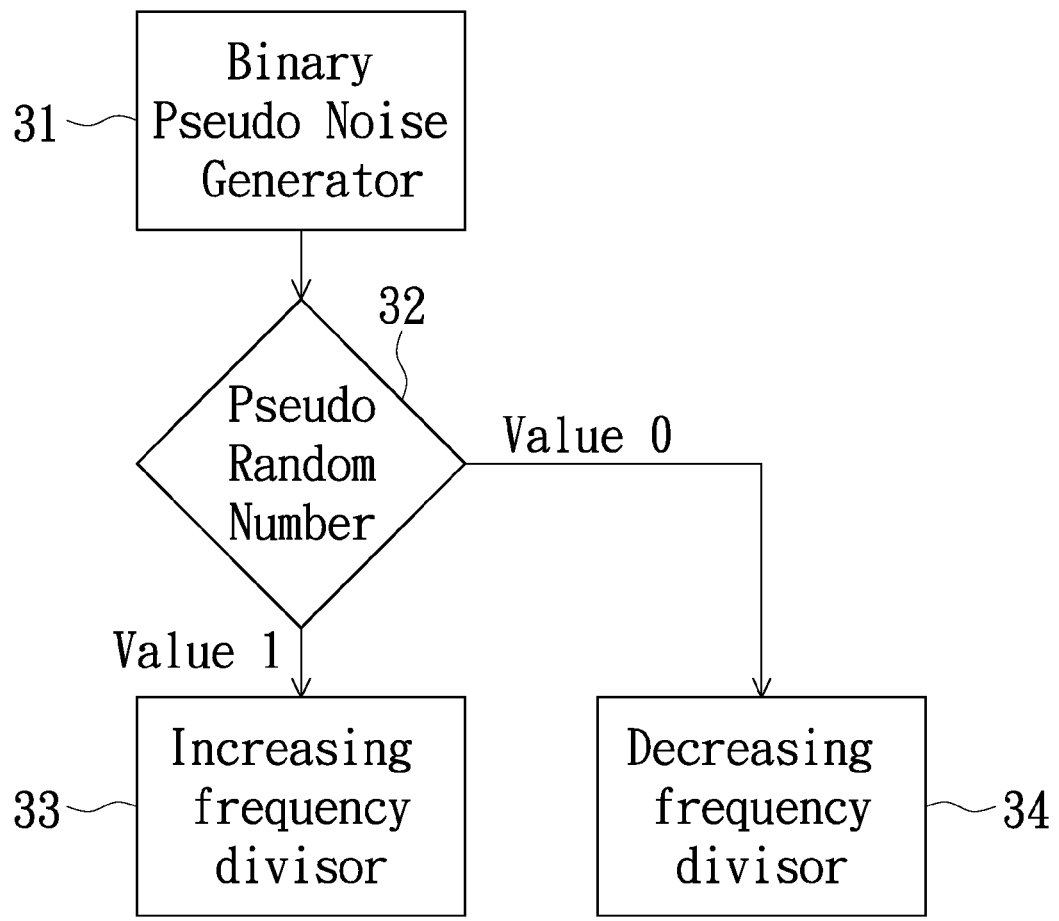
FIG. 3 is a schematic diagram illustrating operation principle of the random walk modulator of the spread spectrum clock generator in FIG. 1 and FIG. 2.

To spread the clock signal spectrum, the random walk modulator 2 is introduced into the spread spectrum clock generator 10 to dynamically adjust the frequency divisor N. The random walk modulator 2 is a digital circuit which generates a modulating signal, e.g. one-dimensional random walk sequence, to adjust the frequency divisor N. For example, the one-dimensional random walk sequence $\{S_n\}$ may be $\{-1, -1, 1, 1, 1, 1, 1, 1, -1, 1, \ldots\}$. Each random walk value of the sequence takes on two values ±1. In other random walk sequence, the random walk value may be selected from other positive/negative integers with identical absolute value. Thus, the factor (frequency divisor) $N_i$ (i=integer) of the frequency divider 15 is adjusted from the initial frequency divisor $N_0$ to $\{N_0-1, N_1-1, N_2+1, N_3+1, N_4+1, N_5+1, N_6+1, N_7+1, N_8-1, N_9+1, \ldots\}$ based on a timing of a clock pulse clk. One operation principle of the random walk modulator 2 is shown in FIG. 3. A binary pseudo noise generator 31 provides pseudo random numbers. Each pseudo random number is either value 0 or value 1. The probabilities of these two values are the same, i.e. 50%. If the pseudo random number is value 1 (block 32), the frequency divisor of the frequency divider 15 is increased by a specific small value, e.g. 1 (block 33). Otherwise, if the pseudo random number is value 0 (block 32), the frequency divisor is decreased by the small value, e.g. 1 (block 34). In an embodiment, the frequency divider 15 changes the frequency divisor N in response to the random walk sequence from the random walk modulator 2.

Figure 4:
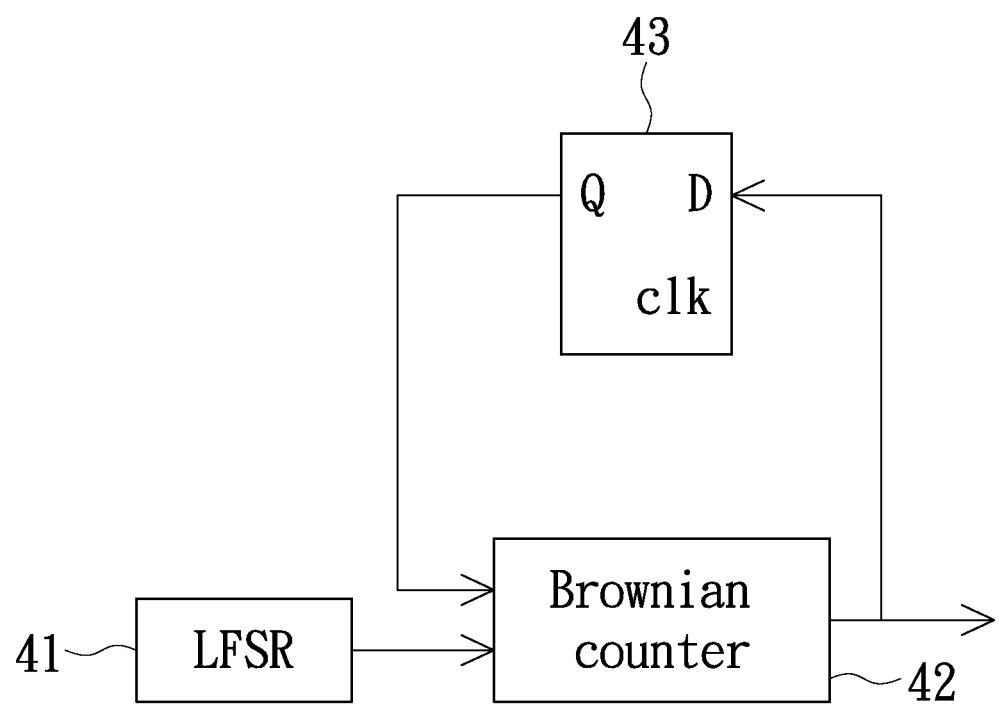
FIG. 4 is a circuit diagram illustrating a random walk modulator of the spread spectrum clock generator in FIG. 1 and FIG. 2.

In FIG. 4, a circuit diagram illustrates an example of the random walk modulator of the spread spectrum clock generator. In this embodiment, the binary pseudo noise generator 31 is implemented by a linear feedback shift register (LFSR) 41 to provide the pseudo random numbers. The output value of the Brownian counter 42 is latched in a D flip-flop 43. If the pseudo random number is value 0, the latched value from the D flip-flop 43 is decreased by a specific small value, e.g. 1 by the Brownian counter 42. Otherwise, if the random noise number is value 1, the output value of the Brownian counter 42 is increased by the same value, e.g. 1. It is to be noted that the random walk modulator 2 is not limited to the described circuits.

According to the random walk model, the deviation between two successive frequency divisors is small, that is different from the statistical random number sequence. In addition, according to the random walk model, the number will cross every point after a certain number of times. Therefore, the frequency of the feedback signal $F_{fb}$ slightly changes and steadily spreads with time. No large jump or drop will be observed on the frequency. Thus, the frequency of the clock signal $F_{out}$ is correspondingly modulated with time through the operations of the phase-frequency detector 11, the charge pumps 12, the loop filter 13 and the voltage-controlled oscillator 14 so that the sharp spectral peak is reduced with spread spectrum. Furthermore, an upper boundary and a lower boundary may be set on the frequency divisor N to limit the deviation of the frequency of the clock signal $F_{out}$ within the tolerance. The upper boundary and the lower boundary may be set by standards or system specifications.

Figure 5A:
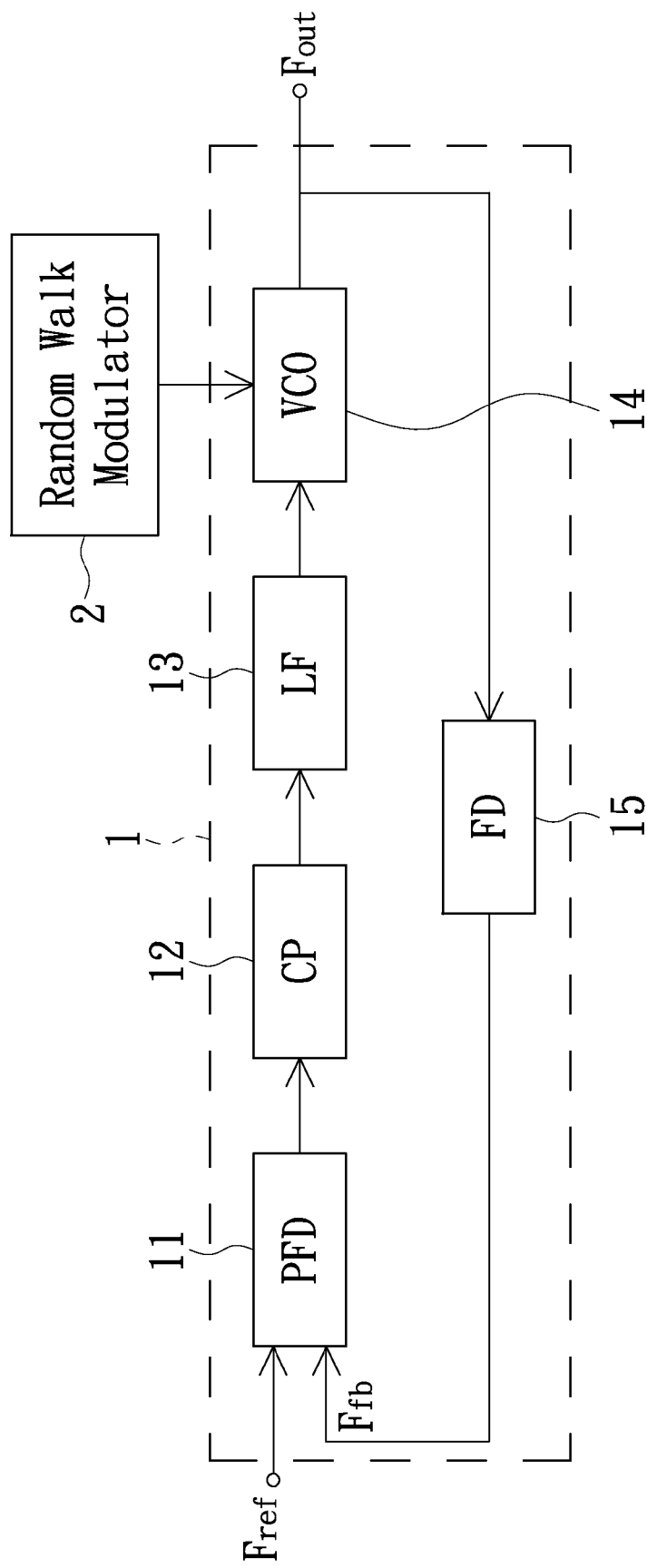
FIGS. 5A~5C are schematic diagrams illustrating spread spectrum clock generators according to other embodiments of the present invention.
Figure 5B:
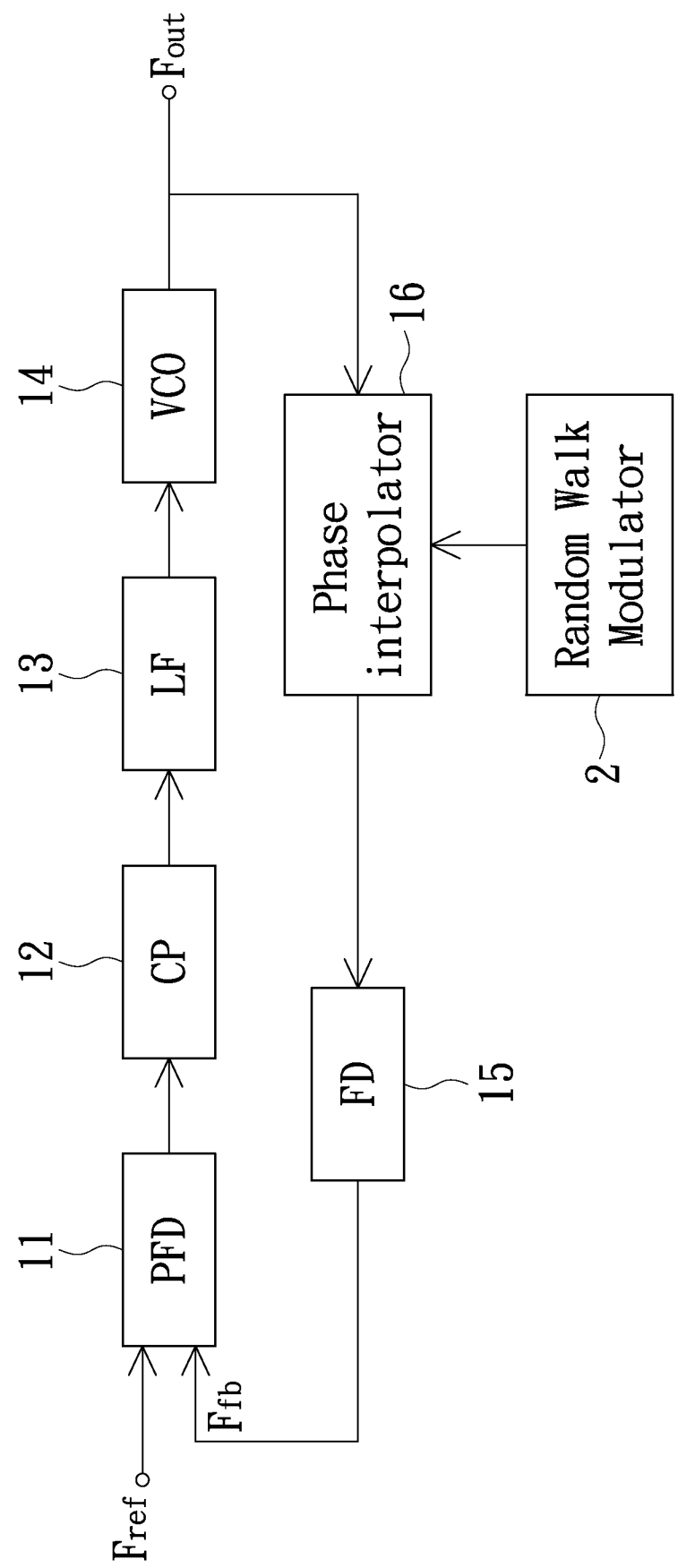
Figure 5C:
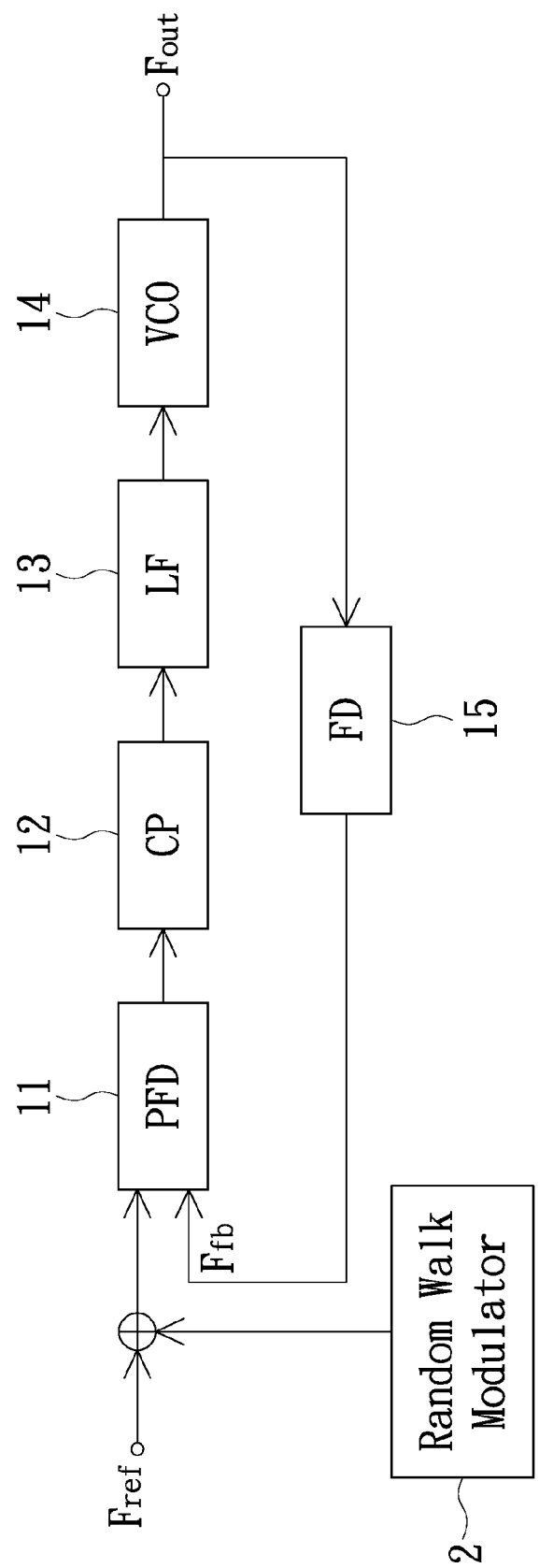

In other embodiments, the random walk modulator 2 may be in communication with other element of the phase-locked loop system 1 rather than the frequency divider 15. FIGS. 5A~5C illustrate other possible spread spectrum clock generators. For example, the random walk modulator 2 may be used to modulate input of the voltage-controlled oscillator 14 (FIG. 5A); create applicable output phase with a phase interpolator 16 between the voltage-controlled oscillator 14 and the frequency divider 15 (FIG. 5B); or modulate the reference clock $F_{ref}$ to be sent to the phase-frequency detector 11 (FIG. 5C). The clock signal $F_{out}$ generated by the voltage-controlled oscillator 14 is gradually modified to achieve the spread spectrum purpose wherever the random walk modulator 2 is introduced into the spread spectrum clock generator 10.

Furthermore, the architecture of the phase-locked loop system 1 is not limited to the architecture in FIG. 2. There are several variations of the phase-locked loop system 1 and all variations are applicable to the spread spectrum clock generator 10 of the present application. For example, linear phase-locked loops, digital phase-locked loops (DPLL), and all digital phase-locked loops (ADPLL) can be used with the random walk modulator 2. Since these variations and modifications can be derived from the description in the specification for a person having ordinary skill in the art, the detailed architectures of possible applications are not redundantly explained herein.

According to the present application, a method for generating a spread spectrum clock signal is provided. The method includes, but not limited to steps of: generating a modulating signal according to a random walk model; and generating a clock signal with spread spectrum in response to the modulating signal. Detailed description about these steps is given as follows.

Figure 6:
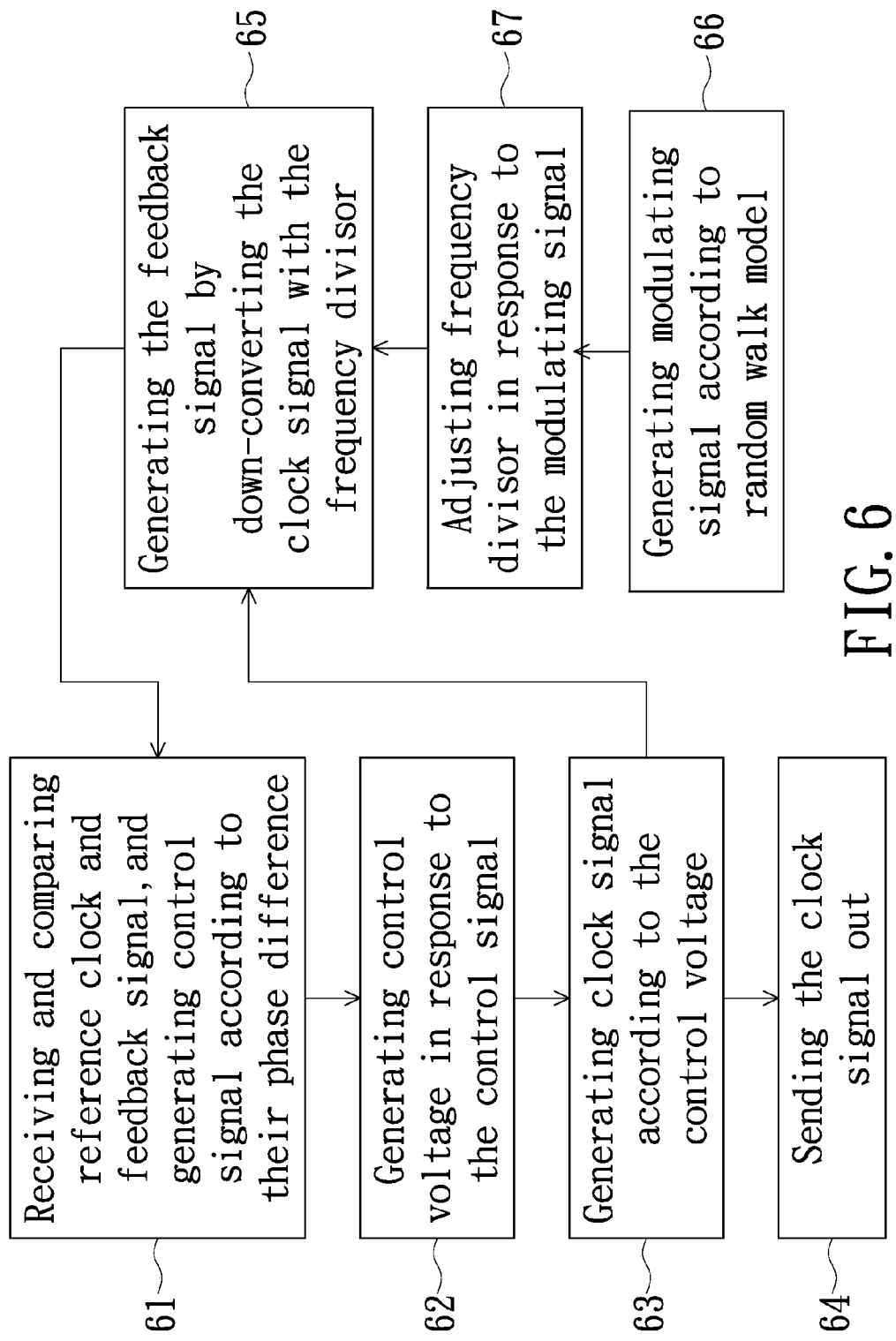
FIG. 6 is a flow chart illustrating a clock-generating method according to an embodiment of the present invention.

In FIG. 6, a flow chart illustrates a clock-generating method according to an embodiment of the present invention. At first, the reference clock is received and compared to generate a control signal according a phase difference/frequency difference between the reference clock and the feedback signal (step 61). Then, a control voltage is generated in response to the control signal (step 62). Thus, a clock signal is generated according to the level of the control voltage (step 63) and sent out (step 64). To maintain the frequency of the clock signal within an acceptable tolerance, the clock signal is down-converted with a frequency divisor to provide the feedback signal (step 65) for the comparison in the step 61. Before performing the down-conversion step, a modulating signal is generated according to a random walk model (step 66) so as to adjust the frequency divisor in response to the modulating signal (step 67).

The modulating signal may be a random walk sequence. Each random walk value in the random walk sequence may be generated (triggered) based on a timing of a clock pulse. The frequency divisor is adjusted according to the random walk sequence by steps of: providing a random walk sequence according to Brownian motion wherein each random walk value is selected from two positive/negative integers with an identical absolute value, and probabilities of the two integers are the same in the random walk sequence; obtaining a new frequency divisor by adding the absolute value to a previous frequency divisor if the random walk value is the positive integer or subtracting the absolute value from the previous frequency divisor if the random walk value is the negative integer. In another embodiment, the frequency divisor with boundary may be generated by steps of: providing an integer set in which an interval between every successive two integers is a constant value ({950, 951, 952, . . . , 1000, 1001, 1002, . . . , 1050} where the interval is 1, for example); selecting one of the integers in the integer set as a first frequency divisor (e.g. 1004) at a first time; and selecting one of the integers immediately previous or next to the previously selected integer as the following frequency divisor (e.g. 1003 or 1005) at a second time. The steps are repeated to obtain a series of frequency divisors. According to the random walk model, the probabilities of selecting a bigger and a smaller next frequency divisor are the same, e.g. 50%.

As described with reference to FIGS. 5A~5C, for generating the spread spectrum clock signal, it is not the only way by modulating the frequency divisor of the frequency divider. For example, the control voltage $V_{ctrl}$ for driving the voltage-controlled oscillator 14 may be modulated to achieve the spread spectrum purpose. In another embodiment, the frequency divider 15 may receive the clock signal $F_{out}$ with slight phase modulation. In a further embodiment, the reference clock $F_{ref}$ is modulated before the comparison step. These variations and modifications can be derived from the description for a person having ordinary skill in the art, and the detailed steps are not redundantly explained.

According to the present disclosure, the electromagnetic interference problem is overcome by the spread spectrum techniques. In particular, the random walk model is used to modulate the clock signal. Thus, electrical field strength does not concentrate at a center frequency or a small frequency range. Instead, the electrical field strength of the spectrum can be gradually spread without large jump or drop phenomenon.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A spread spectrum clock generator, comprising:
a random walk modulator for generating a modulating signal according to a random walk model; and
a phase-locked loop system, in communication with the random walk modulator, for receiving the modulating signal and generating a clock signal with spread spectrum in response to the modulating signal,
wherein the phase-locked loop system comprises:
a phase-frequency detector for receiving and comparing a reference clock and a feedback signal, and generating a control signal according a phase difference between the reference clock and the feedback signal;
a charge pump for generating a control voltage in response to the control signal from the phase-frequency detector;
a voltage-controlled oscillator, in communication with the charge pump, for generating the clock signal according to the control voltage from the charge pump; and
a frequency divider, in communication with the voltage-controlled oscillator and the phase-frequency detector, for receiving the clock signal from the voltage-controlled oscillator and generating the feedback signal to the phase-frequency detector by down-converting the clock signal with a frequency divisor,
wherein the frequency divisor is adjusted by steps of:
providing an integer set, an interval between every successive two integers in the integer set being a constant value;
selecting one integer in the integer set as a first frequency divisor at a first time; and
selecting another integer in the integer set immediately previous or next to the selected integer as a second frequency divisor at a second time.

2. The spread spectrum clock generator according to claim 1 wherein the phase-locked loop system further comprises a loop filter, in communication with the charge pump and the voltage-controlled oscillator, for filtering out a high-frequency portion of the control voltage.

3. The spread spectrum clock generator according to claim 1 wherein the charge pump further filters out a high-frequency portion of the control voltage.

4. The spread spectrum clock generator according to claim 1 wherein the charge pump is integrated into the phase-frequency detector.

5. The spread spectrum clock generator according to claim 1 wherein the random walk modulator is in communication with the frequency divider to dynamically adjust the frequency divisor of the frequency divider by adding an integer to the frequency divisor or subtracting the integer from the frequency divisor.

6. The spread spectrum clock generator according to claim 5 wherein the integer is 1.

7. The spread spectrum clock generator according to claim 1 wherein the random walk modulator is in communication with the frequency divider to dynamically adjust a phase of the clock signal to be received by the frequency divider.

8. The spread spectrum clock generator according to claim 1 wherein the random walk modulator is in communication with the voltage-controlled oscillator to dynamically adjust the control voltage to be received by the voltage-controlled oscillator.

9. The spread spectrum clock generator according to claim 1 wherein the modulating signal is a random walk sequence according to the random walk model.

10. A spread spectrum clock generator, comprising:
a phase-frequency detector for receiving and comparing a reference clock and a feedback signal, and generating a control signal according a phase difference between the reference clock and the feedback signal;
a charge pump, in communication with the phase-frequency detector, for generating a control voltage in response to the control signal from the phase-frequency detector;
a voltage-controlled oscillator, in communication with the charge pump, for generating a clock signal according to the control voltage from the charge pump;
a frequency divider, in communication with the voltage-controlled oscillator and the phase-frequency detector, for receiving the clock signal from the voltage-controlled oscillator, and generating the feedback signal to the phase-frequency detector by down-converting the clock signal with a frequency divisor; and
a random walk modulator, in communication with the frequency divider, for generating a modulating signal according to a random walk model to adjust the frequency divisor,
wherein the modulating signal is a random walk sequence and the frequency divisor is adjusted according to the random walk sequence by sub-step of:
providing the random walk sequence according to Brownian motion wherein each random walk value is selected from a positive integer and a negative integer with an identical absolute value, and probabilities of the two integers are the same in the random walk sequence; and
obtaining a current frequency divisor by adding a corresponding random walk value in the random walk sequence to a previous frequency divisor.

11. The spread spectrum clock generator according to claim 10 wherein the spread spectrum clock generator further comprises a loop filter, in communication the charge pump and the voltage-controlled oscillator, for filtering out a high-frequency portion of the control voltage.

12. A method for generating a spread spectrum clock signal by a clock generator, the method comprising steps of:
generating a modulating signal according to a random walk model;
sending the modulating signal to a phase-locked loop system of the clock generator; and
the phase-locked loop system generating a clock signal with spread spectrum in response to the modulating signal,
wherein the step of generating the clock signal with spread spectrum comprising sub-steps of:
receiving and comparing a reference clock and a feedback signal, and generating a control signal according to a phase difference between the reference clock and the feedback signal;
generating a control voltage in response to the control signal;
generating the clock signal according to the control voltage; and
generating the feedback signal by down-converting the clock signal with a frequency divisor,
wherein the modulating signal is a random walk sequence and the frequency divisor is adjusted according to the random walk sequence by sub-step of:
providing the random walk sequence according to Brownian motion wherein each random walk value is selected from a positive integer and a negative integer with an identical absolute value, and probabilities of the two integers are the same in the random walk sequence; and
obtaining a current frequency divisor by adding a corresponding random walk value in the random walk sequence to a previous frequency divisor.

13. The method according to claim 12 wherein the frequency divisor is adjusted by adding an integer to the frequency divisor or subtracting the integer from the frequency divisor according to the modulating signal.

14. The method according to claim 12 wherein the frequency divisor is adjusted by sub-step of:
providing an integer set, an interval between every successive two integers in the integer set being a constant value;
selecting one integer in the integer set as a first frequency divisor at a first time; and
selecting another integer in the integer set immediately previous or next to the selected integer as a second frequency divisor at a second time.

15. The method according to claim 14 wherein the probability of selecting the immediately previous integer is 50% and the probability of selecting the immediately next integer is 50%.

16. The method according to claim 12 wherein a phase of the clock signal is adjusted according to the modulating signal before the feedback signal is generated by down-converting the clock signal.

17. The method according to claim 12 wherein the control voltage is adjusted according to the modulating signal after the sub-step of generating the control voltage.

* * * * *